United States Patent
Wang et al.

(10) Patent No.: US 10,951,840 B1
(45) Date of Patent: Mar. 16, 2021

(54) VERSATILE IMAGE SENSOR CIRCUIT

(71) Applicant: OMNIVISION TECHNOLOGIES, INC., Santa Clara, CA (US)

(72) Inventors: Rui Wang, San Jose, CA (US); Hiroaki Ebihara, Santa Clara, CA (US); Eiichi Funatsu, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 19 days.

(21) Appl. No.: 16/555,796

(22) Filed: Aug. 29, 2019

(51) Int. Cl.
*H04N 5/347* (2011.01)
*H04N 5/378* (2011.01)
*H01L 27/146* (2006.01)

(52) U.S. Cl.
CPC ............. *H04N 5/347* (2013.01); *H04N 5/378* (2013.01); *H01L 27/14645* (2013.01)

(58) Field of Classification Search
None
See application file for complete search history.

(56) References Cited

U.S. PATENT DOCUMENTS

| | | | |
|---|---|---|---|
| 10,334,189 B1* | 6/2019 | Xu | H04N 9/045 |
| 2012/0312963 A1* | 12/2012 | Storm | H04N 5/378 |
| | | | 250/208.1 |
| 2013/0089175 A1* | 4/2013 | Mo | H04N 5/3532 |
| | | | 377/49 |
| 2015/0201139 A1* | 7/2015 | Funatsu | H04N 5/37457 |
| | | | 348/273 |
| 2018/0070029 A1* | 3/2018 | Centen | H04N 5/3575 |

\* cited by examiner

*Primary Examiner* — James M Hannett
(74) *Attorney, Agent, or Firm* — Christensen O'Connor Johnson Kindness PLLC

(57) ABSTRACT

A photodiode array circuit includes a plurality of photodiode circuits, binning circuitry, and a plurality of output circuits. Each of the plurality of photodiode circuits is coupled to receive a different one of the plurality of transfer control signals as a proximate photodiode circuit, proximate in a first direction. The binning circuitry is coupled to electrically connect the plurality of photodiode circuits into groups of photodiode circuit sense nodes in response to a binning control signal. Each of the plurality of output circuits is coupled to one of the groups of photodiode circuit sense nodes. Each of the plurality of output circuits are coupled to receive the output charge from the photodiode circuits in the one of the groups of photodiode circuit sense nodes and output an output signal to a bitline in response to the output charge and an row select signal.

22 Claims, 5 Drawing Sheets

VERSATILE IMAGE SENSOR CIRCUIT

BACKGROUND INFORMATION

Field of the Disclosure

This disclosure relates generally to image sensor circuits, in particular to image sensor circuits with various image capturing modes.

Background

Image sensors may be used in various devices including cameras, sensors, and consumer electronics. As image sensors have become more advanced the circuits within the image sensors have become more complex.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1A:
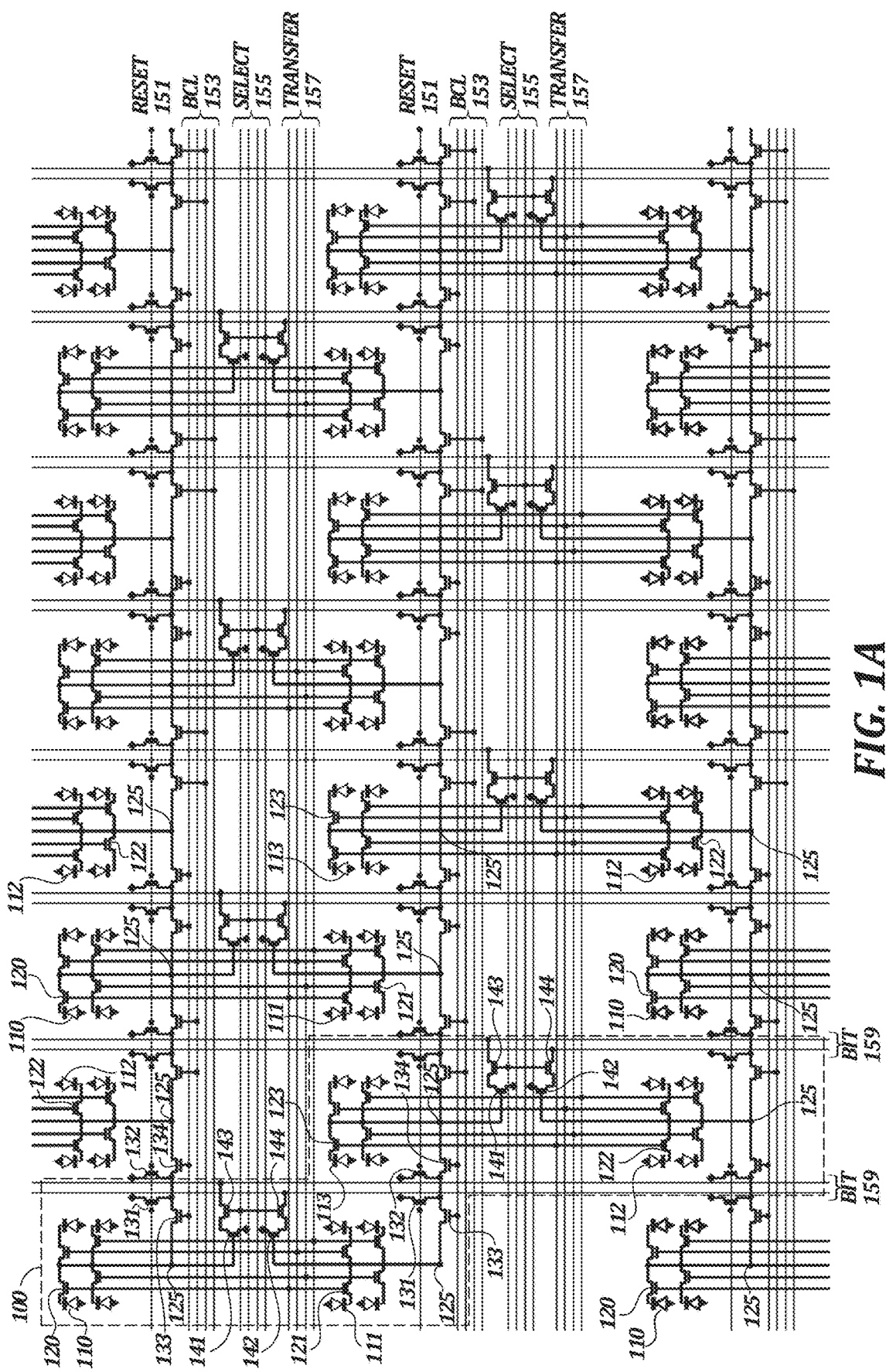
FIGS. 1A-C illustrate an example image sensor circuit in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples directed to image sensor circuits and devices and methods for utilizing image sensor circuits are disclosed herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Image sensors sometimes include circuitry that adds together the inputs from the photodiodes in different combinations depending on a capture mode. This ability to combine the inputs from the photodiodes in different combinations comes at the cost of greater complexity in the circuit and a large number of control signal wires.

Example image sensor circuits disclosed herein have an architecture which allows for greater versatility while including fewer conductive lines than other image sensor circuits. The architecture allows for groupings to add photodiode outputs and also to add capacitances.

Figure 1B:
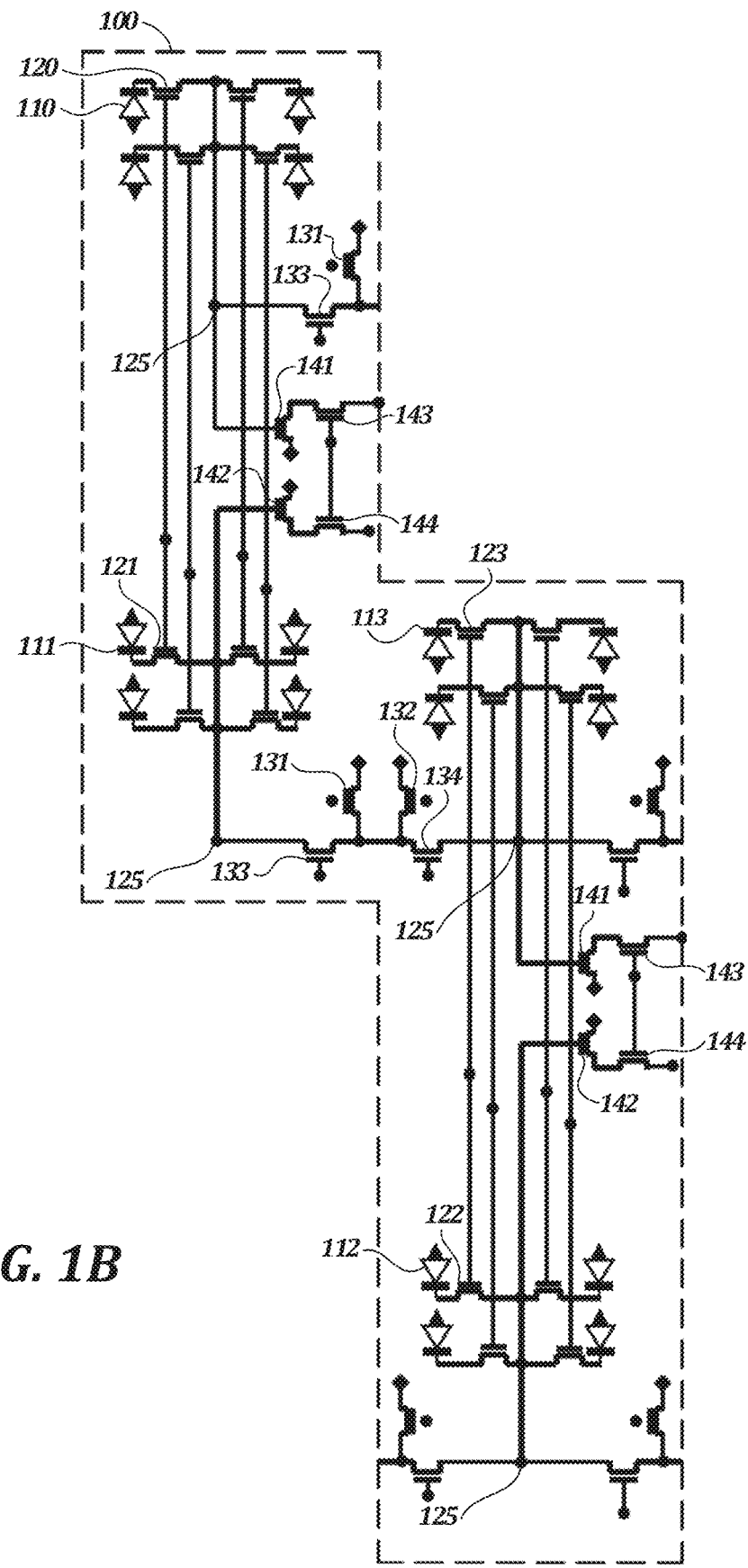

FIGS. 1A and 1B illustrate an example image sensor circuit in accordance with the teachings of the present invention. The image sensor circuit includes photodiodes 110-113, transfer transistors 120-123, amplifying transistors 141, 142, row select transistors 143, 144, binning transistors 133, 134, reset transistors 131, 132, reset lines 151, binning control lines 153, select lines 155, transfer lines 157, and bitlines 159. Each set of binning control lines 153 may be grouped together with one set of select lines 155 and one set of transfer lines 157. The transfer transistors 120-123 may be organized into four sets of four having a "zig-zag" pattern 100.

The reset lines 151, binning control line 153, select lines 155, transfer lines 157, and bitlines 159 may all be conductive lines made of a conductor such as aluminum or another metal.

Each of the transfer transistors 120-123 may be connected as a switch between the respective one of the photodiodes 110-113 and a gate of a respective one of the amplifying transistors 141, 142 via the sense node 125. The photodiodes 110-113 and transfer transistors 120-123 may be grouped into groups of four. Each first transfer transistor 120 has its gate connected to a respective gate of a second transfer transistor 121 and one of the transfer lines 157. Similarly, each of the third transfer transistors 122 has its gate connected to a respective gate of a fourth transfer transistor 123 and one of the transfer lines 157. Thus, the transfer transistors 120-123 may be switched on or off based on a transfer control signal transmitted over the transfer lines 157. The first and second transfer transistors 120 and 121 may be connected to a different set of transfer lines 157 than the third and fourth transfer transistors 122 and 123. The gates of the second transfer transistors 121 may be coupled to respective gates of the first transfer transistors 120 which are proximate to the second transfer transistors 121 in a vertical direction. Similarly, the gates of the fourth transfer transistors 123 may be coupled to respective gates of the third transfer transistors 122 which are proximate to the fourth transfer transistors 123 in the opposite direction.

The transfer lines 157 may be organized into sets of four lines. Each of the transfer transistors 120-123 in the set of transfer transistors 120-123 has its gate connected to a different one of four transfer lines 157 in a set of transfer lines 157. Accordingly, the transfer transistors may operate as switches based on a transfer control signal transmitted over the transfer lines 157. Each set of transfer lines 157 may receive a portion of the transfer control signal. Further, each transfer line may receive a smaller portion of the transfer control signal. Accordingly, each transfer transistor 120-123 may be controlled by a portion of the transfer control signal.

Each photodiode 110-113 may represent a different color collection. For example, first photodiode 110 may be a red photodiode, second photodiode 111 may be green, third photodiode 112 may be green as well, and fourth photodiode 113 may be blue. Each transfer transistor 120-123 may collect output charges from a different color of photodiode at a sense node 125. For example, the first transfer transistor 120 may be for collecting output charges from red photodiodes, the second transfer transistor 121 may be for collecting from green photodiodes, the third transfer transistor 122 may be for collecting from green photodiodes as well, and the fourth transfer transistor 123 may be for collecting from blue photodiodes. Each transfer transistor 120-123 collects charges from the respective photodiode 110-113 connected to the source of the transfer transistors. The charges collected from the photodiodes 110-113 may be collected at a sense node 125 between the drain of the transfer transistors 120-123 and the gate of the amplifying transistors 141, 142.

In a standard Bayer filter, a red, a blue, and two green color filters are grouped together in a square. In the depicted example, a pattern of a red and a blue and two green photodiodes sets are grouped together, however they are arranged in a zig-zag pattern 100 where the red first diodes 110, the green second photodiodes 111, and the first and second transfer transistors 120, 121 are not connected to the same set of transfer lines 157 as the green third photodiodes 112, the blue fourth photodiodes 113 and the third and fourth transfer transistors 122, 123. This makes it so the transfer transistors 120-123 are not arranged in a square but in the zig-zag pattern 100, as illustrated for example in FIG. 1 in accordance with the teachings of the present invention. This zig-zag arrangement allows for greater versatility while reducing the number of transfer lines 157 needed. The sets of transfer transistors 120-123 along with the respective photodiodes 110-113 may also be referred to as photodiode circuits.

The sets of transfer transistors 120-123 may be arranged in a grid, such that in a vertical direction and in a horizontal direction (with relation to the illustration of FIG. 1A, the circuit may be oriented in any direction) the sets of transfer transistors 120-123 alternate between two different sets of transfer transistors 120-123.

As illustrated, in a first column, the sets of transfer transistors 120-123 may alternate between a set of first transfer transistors 120 and a set of second transfer transistors 121. In a second column, the sets of transfer transistors 120-123 may alternate between a set of third transfer transistors 122 and a set of fourth transfer transistors 123. Similarly, in a first row, the sets of transfer transistors 120-123 may alternate between a set of first transfer transistors 120 and a set of third transfer transistors 122. In a second row, the sets of transfer transistors 120-123 may alternate between a set of second transfer transistors 121 and a set of fourth transfer transistors 123. The image sensor circuit may alternate between first rows and second rows in the vertical direction and between first columns and second columns in the horizontal direction. Although three rows and eight columns are depicted in FIG. 1A, the image sensor circuit may be any size.

As stated above each of the amplifying transistors 141 and 142 may be connected to a sense node 125 of a set of transfer transistors 120-123. First amplifying transistor 141 may be connected to a sense node 125 set of first transfer transistors 120 or a sense node 125 of a set of fourth transfer transistors 123. Second amplifying transistor 142 may be connected to a sense node 125 of a set of second transfer transistors 121 or a sense node 125 of a set of third transfer transistors 122. The amplifying transistors 141, 142 may be connected to a pair of sense nodes 125 of sets of transfer transistors 120-123 in the same column. A drain of the amplifying transistors 141, 142 may be connected to a voltage rail (not shown) or other voltage source. The source of the amplifying transistors 141, 142 may be connected to the drain of the row select transistors 143, 144, respectively. The source of the row select transistors 143, 144 may be connected to respective bitlines 159. The row select transistors 143, 144 may be organized into pairs with the gate of a first row select transistor 143 connected to the gate of a second row select transistor 144 and to one of the select lines. Each of row select transistors 143, 144 in the pair of row select transistors 143, 144 may be connected to a different bitline. Thus, a row select signal transmitted over the select lines 155 may control which row select transistors 143, 144 output to the bitlines 159. Each set of amplifying transistors 141 and 142 and row select transistors 143 and 144 may be referred to as an output circuit.

Each pair of row select transistors 143, 144 has the gates of the first and second row select transistors 143 and 144 connected to one of the select lines 155. The pairs of row select transistors 143, 144 may be connected to different select lines 155. The select lines 155 may be organized into sets of four lines. Each set of select lines 155 may receive a portion of a row select signal. Each row select transistors may receive a smaller portion of the row select signal. Accordingly, each row select transistor 143, 144 may be controlled by a portion of the row select signal.

The output circuits may be organized into rows between the rows of sets of transfer transistors 120-123. Each output circuit in a row of output circuits may be connected to one of the select lines 155 in a set of select lines 155. For example, as illustrated in FIG. 1A, a first pair of row select transistors 143, 144 may be connected to a first select line 155, a second pair of row select transistors 143, 144 may be connected to a second select line 155 in the same set of select lines 155 as the first select line 155, a third pair of row select transistors 143, 144 may be connected to a third select line 155 in the same set of select lines 155 as the first select line 155, and a fourth pair of row select transistors 143, 144 may be connected to a fourth select line 155 in the same set of select lines 155 as the first select line 155. This pattern may repeat and continue in the horizontal direction. Other sizes of sets of select lines 155 and patterns of connection are possible as well.

Restated, the output circuits, including the amplifying transistors 141, 142 and the row select transistors 143, 144, are each coupled to two sets of transfer transistors 120-123 and two bitlines. The output circuits are coupled to receive the collected charges from the sensing nodes 125 of the two sets of transfer transistors 120-123. And the output circuits are coupled to output an output signal to one or both of the two bitlines in response to a row select signal. The output signal is based on to the row select signal, the collected charges at the sensing node 125 and the connected groups of sets of transfer transistors 120-123.

Sets of transfer transistors 120-123 may be connected in the horizontal direction by the binning transistors 133 and 134. Binning transistors 133 and 134 act as switches between the sets of transfer transistors 120-123 in each column and the sense nodes 125 connected to the sets of transfer transistors 120-123. Accordingly, the binning transistors 133, 134 may also function as a binning connecting circuit connecting the sense nodes 125 of two sets of transfer transistors 120-123 that are proximate to each other in the horizontal direction. The binning transistors 133, 134 may be arranged in pairs with a first binning transistor 133 and a second binning transistor 134 in the pair. The gate of each binning transistor 133, 134 in the pair of binning transistors 133, 134 connected to a same one of the binning control lines 153. Thus, the connection of the sets of transfer transistors 120-123 may be controlled by a binning control signal transmitted over the binning control lines 153. A group of reset transistors (or reset switches) 131 and 132 and binning transistors 133 and 134 may be referred to as a binning circuit.

The binning control lines 153 may be organized into groups of four. The binning circuits may be organized into rows corresponding to the rows of sets of transfer transistors 120-123. Each set of binning transistors 133, 134 in a given row may be connected to one of the four binning control lines 153 in a set of binning control lines 153. As will be described in further detail below, the sets of binning transistors 133, 134 may be connected to the binning control lines 153 based on how the binning of the sets of transfer transistors 120-123 is performed. Each set of binning control lines 153 may receive a portion of the binning control signal. Further, each binning control line may receive a smaller portion of the binning control signal. Accordingly, each binning transistor 133, 134 may be controlled by a portion of the binning control signal.

Each reset transistors 131, 132 may have its source connected between the first and second binning transistors 133 and 134. The gates of the reset transistors 131, 132 may be connected to a reset line and receive a reset signal through the reset line. A drain of the reset transistors 131, 132 may be connected to a reset voltage or charges at the sense node 125. When the reset transistors 131, 132 and binning transistors 133 and 134 are on, the reset voltage is transferred sense node 125. The charges from the photodiodes 110-113 will lower a voltage at the sense node 125 and consequently a gate of the amplifying transistor 141, 142 when collected. Accordingly, the reset voltage is a voltage higher than the ground voltage.

FIG. 1B illustrates a section of FIG. 1A as an example of the zig-zag pattern 100 with the reset lines 151, binning control lines 153, select lines 155, transfer lines 157, and bitlines 159 not shown. Gates of the first set of transfer transistors 120 are connected to gates of the second set of transfer transistors 121 which are proximate to the first set of transfer transistors 120 in the vertical direction. The fourth set of transfer transistors 123 is proximate to the second set of transfer transistors 121 in the horizontal direction. The third set of transfer transistors is connected to the first set of transfer transistors via binning transistors 133 and 134 when the binning transistors are on. Gates of the third set of transfer transistors are connected to gates of the fourth set of transfer transistors in the direction opposite the vertical direction. The first set of transfer transistors 120 and the second set of transfer transistors 121 transmit charges to the same output circuit (including amplifying transistors 141, 142 and row select transistors 143 and 144). The third set of transfer transistors 122 and the fourth set of transfer transistors 123 transmit charges to a different output circuit (including amplifying transistors 141, 142 and row select transistors 143 and 144).

Restated, the second and fourth sets of transfer transistors 121, 123 are in the same row. The first set of transfer transistors 120 is in the row above the second and fourth sets of transfer transistors 121, 123. The third set of transfer transistors 122 is in the row below the second and fourth sets of transfer transistors 121, 123. The first and second sets of transfer transistors 120, 121 are vertically aligned in the first column. The third and fourth sets of transfer transistors 122 and 123 are vertically aligned in the second column proximate to the first column in the horizontal direction.

Figure 1C:
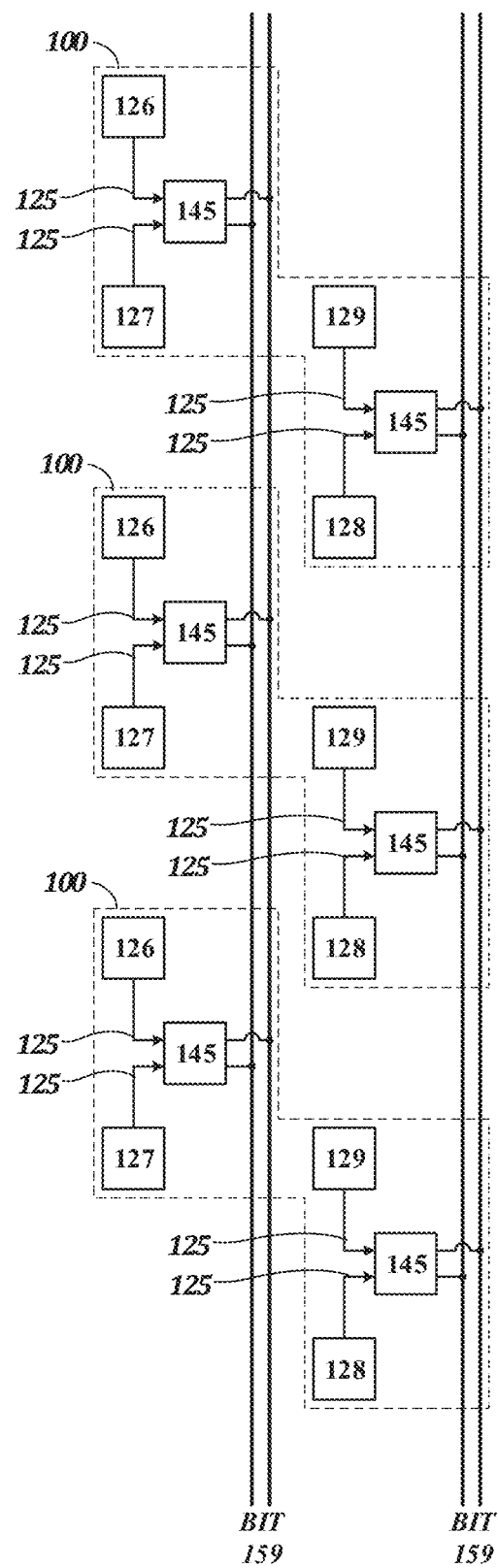

FIG. 1C illustrates the connection of the output circuits 145 to the bitlines 159. For simplicity in explaining the connection of the output circuits 145, the reset lines 151, the BCL lines 153, the binning circuits (including binning transistors 133, 134 and reset transistors 131, 132), the select lines 155, and the transfer lines 157 are not shown. FIG. 1C illustrates as blocks: output circuits 145, first photodiode circuits 126, second photodiode circuits 127, third photodiode circuits 128, and fourth photodiode circuits 129. The output circuits 145 include the amplifying transistors 141, 142 and the output transistors 143, 144. The first-fourth photodiode circuits 126-129 include the first-fourth photodiodes 110-113 and the first-fourth transfer transistors 120-123, respectively.

The bitlines 159 may be in pairs, each pair being for one column of the photodiode circuits 126-129 and output circuits 145. The output circuits 145 in the first column output the output signal based on the charges collected at the sensing nodes 125 of the first photodiode circuits 126 and the second photodiode circuit 127 to the bitlines 159 of the first column. The output signal based on the charges collected at the sensing nodes 125 of the first photodiode circuits 126 in the first column are output to a first bitline 159 for the first column, and the output signal based on the charges collected at the sensing nodes 125 of the second photodiode circuits 127 in the first column are output to a second bitline 159 for the first column. Similarly, the output circuits 145 in the second column output the output signal based on the charges collected at the sensing nodes 125 of the third photodiode circuits 128 and the fourth photodiode circuit 129 to the bitlines 159 of the second column. The output signal based on the charges collected at the sensing nodes 125 of the third photodiode circuits 128 in the second column are output to a first bitline 159 for the second column, and the output signal based on the charges collected at the sensing nodes 125 of the fourth photodiode circuits 129 in the second column are output to a second bitline 159 for the second column.

As will be explained in greater detail below, multiple output signals from multiple output circuits 145 may be output to a single bitline 159 at the same time. The effect of outputting multiple output signals to a single bitline at one time is the summing of the output signals. Accordingly, multiple output signals may be summed on bitlines 159. Further, as described with relation to the binning circuits. Several sensing nodes 125 may be connected and the collected charges of the connected several sensing nodes 125 may be binned. Accordingly, it is possible to sum outputs signals based on binned collected charges on a bitline 159. Thus, binning schemes such as 2×2 binning and 3×3 binning may be accomplished.

Figure 2:
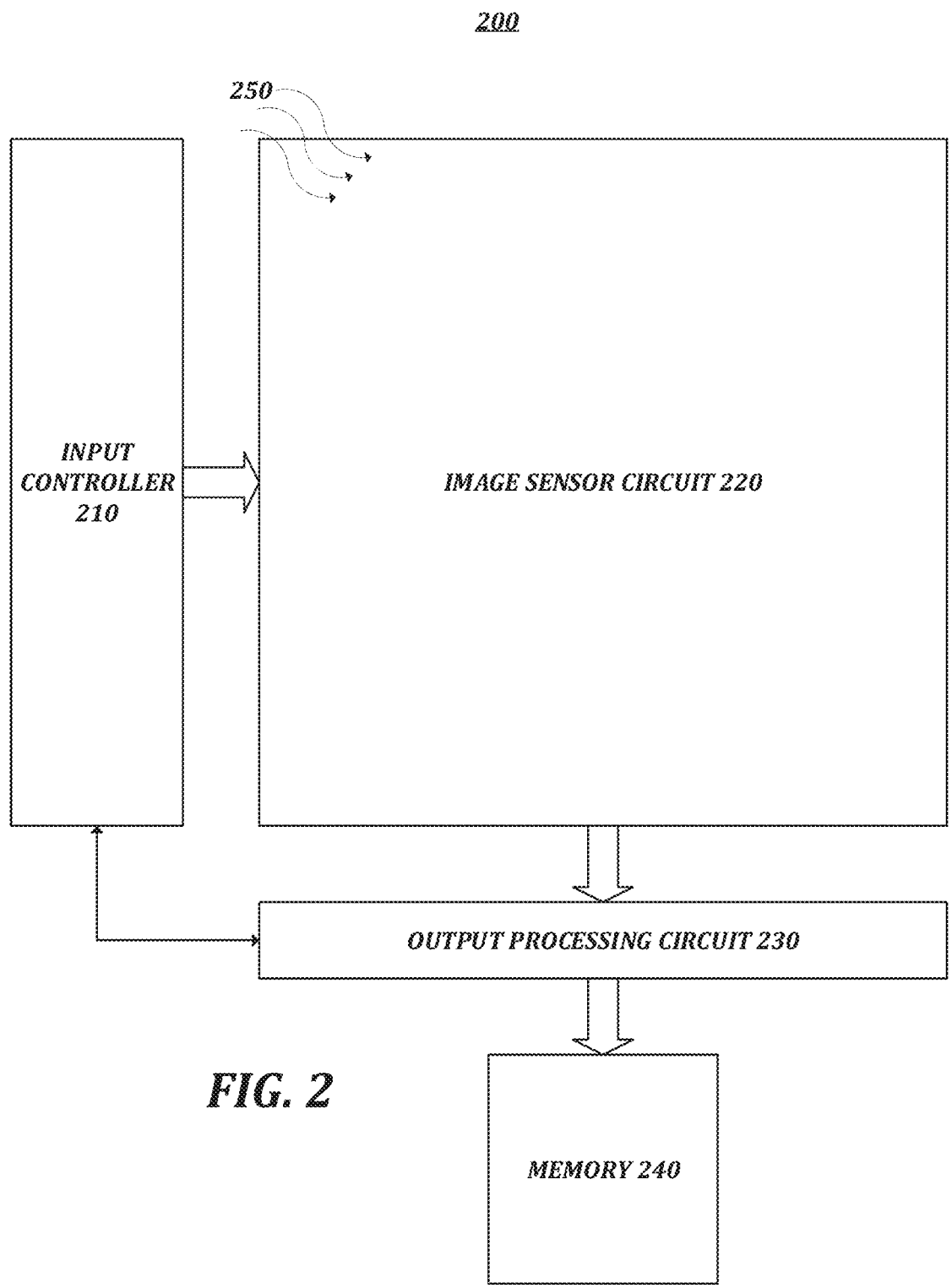
FIG. 2 illustrates an example of a device including an image sensor circuit in accordance with the teachings of the present invention.

FIG. 2 illustrates an example of a device 200 including an image sensor circuit 220 in accordance with the teachings of the present invention. The device 200 may include an input controller (controller) 210, an image sensor circuit 220, an output processing circuit 230, and a memory 240.

The input controller 210 may be coupled to control inputs to the image sensor circuit 220. The inputs may include reset signals transferred over the reset lines 151, binning control signals transferred over the binning control lines 153, row select signals transferred over the select lines 155, and transfer control signals transferred over the transfer lines 157.

The image sensor circuit 220 may receive the control inputs from the input controller 210 and also light 250. The image sensor may output an image output to the output processing circuit 230 over the bitlines in response to the control inputs and the light 250.

The output processing circuit 230 may receive and processes the image output. The output processing circuit 230 may also communicate with the input controller 210 to adjust the control inputs. The output processing circuit 230 may process the image output into an image or video file and store the image or video file in the memory 240. The memory 240 may also include computer readable instructions for operating the device 200. Output processing circuit 230 may retrieve the computer readable instructions for operating the device 200 from the memory and control the device 200 in response to the computer readable instructions.

The input controller 210 may control the image sensor circuit 220 in a variety of different ways. A first way in which the input controller 210 may control the image sensor circuit 220 is by controlling the number of pixels whose output charges are collected. This may be done by transmitting a transfer control signal over a set of transfer lines 157 where some of the transfer lines 157 do not have a voltage sufficiently high to turn on the transfer transistors 120-123 connected to the transfer line. Any voltage sufficient to turn on the transfer transistors 120-123 connected to the transfer line may be referred to as an "on voltage," any voltage that is insufficient to turn on the transfer transistors 120-123 may be referred to as an "off voltage." This convention may also refer to voltages sufficient to turn on other transistors. In one example, the transfer control signal may only include an on voltage for one of the transfer lines 157 such that the output charges of only one of the photodiodes 110-113 is collected at the sense node 125. Any combination of on and off voltages may be transmitted by the input controller 210 to the transfer lines 157.

A second way in which the input controller 210 may control the image sensor circuit 220 is by controlling the binning of the sets of transfer transistors 120-123. For example, the sets of transfer transistors may be grouped into groups of 1, 2, 4, or 6 sets of transfer transistors by transmitting the binning control signal over the binning control lines 153. This will be explained in greater detail below.

A third way in which the input controller 210 may control the image sensor circuit 220 is by controlling the row select signal transmitted via the select lines 155. This will control which bitlines receive an output signal (or output voltage), and from which row select transistors 143, 144 transmit output signals to the bitlines. Since multiple output circuits may output to the same bitlines, the row select signal may quickly cycle through multiple groups of select lines 155 in order to capture an image or video.

The input controller 210 also controls the reset signal transmitted via the reset lines 151. When the reset signal and the binning control signal associated with the line to which the binning circuit is connected are on voltages at the same time, the voltage of the gate of the amplifying transistor 141, 142 connected to the binning circuit is reset. Accordingly, a fourth way in which the input controller 210 may control the image sensor circuit 220 is by controlling the reset signal and the binning control signal together to reset the voltages at the amplifier gates 141, 142.

These various ways in which the input controller 210 can control the image sensor circuit 220 may be combined to sense an image based on the light 250 in various modes as will be explained in further detail below.

As one example, the input controller 210 may control the image sensor circuit 220 to output what is sensed by one photodiode 110-113 for each set of transfer transistors 120-123. This may be accomplished by: (1) transmitting a transfer control signal which only includes one on voltage for each set of transfer lines 157; (2) transmitting an row select signal where each group of select lines 155 is provided an on voltage in sets of two groups of select lines 155 sequentially; and (3) transmitting only off voltages in the binning control signal. This process could then be performed for each of the other photodiodes 110-113 for each set of transfer transistors 120-123 by resetting the voltage of the gate of the amplifying transistors 141, 142 and then repeating the controlling of the transfer control signal, the row select signal and the binning control signal, except with a different one of set of the transfer lines 157 receiving the on voltage each time the controlling process is repeated. Thus, the sets of transfer transistors 120-123 may be coupled to selectively sum output charges from photodiodes 110-113 in response to a transfer control signal. This process provides a large amount of detail but takes more time than other processes.

As a second example, the input controller 210 may control the image sensor circuit 220 to output the binned output of groups of six sets of transfer transistors 120-123. Since every other one of the sets of transfer transistors 120-123 in a row are the same color and the others are a different color, the output charges of all six of the sets of transfer transistors 120-123 should not be summed together. This is accomplished by only transmitting transfer control signals with on voltages through the transfer lines 157 connected to one of the colors of the sets of transfer transistors 120-123 at any time. The sets of transfer transistors 120-123 which does not receive a transfer control signal with on voltages will provide capacitance for the collection of the charges for the sets of transfer transistors 120-123 that receive the transfer control signal with the on voltages. For example, in the row of sets of transfer transistors 120-123 including sets of first and third transfer transistors 120 and 122, at any given time the sets of transfer lines 157 connected to the sets of first transfer transistors 120 and the set of transfer lines 157 connected to the third transfer transistors 122 are not both provided with a transfer control signal including an on voltage.

The binning of the groups of six sets of transfer transistors may be accomplished by: (1) transmitting a transfer control signal which including on voltages for a first set of transfer lines 157; (2) transmitting an row select signal to the group of select lines 155 grouped with the first set of transfer lines 157, where the row select signal includes on voltages for each of the select lines 155 in the set; (3) transmitting a binning control signal to the binning control lines 153 grouped with the first set of transfer lines 157, where the binning control signals include on voltages for three of the binning control lines 153, and (4) repeating (1)-(3) for each of the other groups of transfer lines 157. Thus, the binning circuits including binning transistors 133 and 134 may be coupled to electrically connect sets of transfer transistors 120-123 into groups of sets of transfer transistors 120-123 in response to a binning control signal.

This process will output the output voltages on the bitlines for each set of transfer transistors 120-123 connected to the first set of transfer lines 157. For example, sets of first and second transfer transistors 120 and 121 or sets of third and fourth transfer transistors 122 and 123.

A source follower binning process (where the outputs are binned at the bitlines, associated with voltages from the source follower row select transistors) may also be performed by the input controller 210 by providing transfer control signals and row select signals with on voltages to multiple groups of transfer lines 157 and select lines 155. For example, a 3×3 binning process may also be performed by performing the binning of the groups of six sets of transfer transistors, as described above, to three sets of transfer lines 157 and select lines 155 at a time (the sets of transfer lines 157 and select lines 155 being every other set in a vertical direction so that the output charges are only for three of the first rows or three of the second rows). Any number of other binning schemes such as 2×1, 2×2, 3×1 may also be performed by the input controller 210.

The time required to perform a 3×3 binned output may be significantly faster than an output from a 1×1 output (about 36 times faster), however, the amount of detail in the end image or video will be less (about ⅑th).

Figure 3:
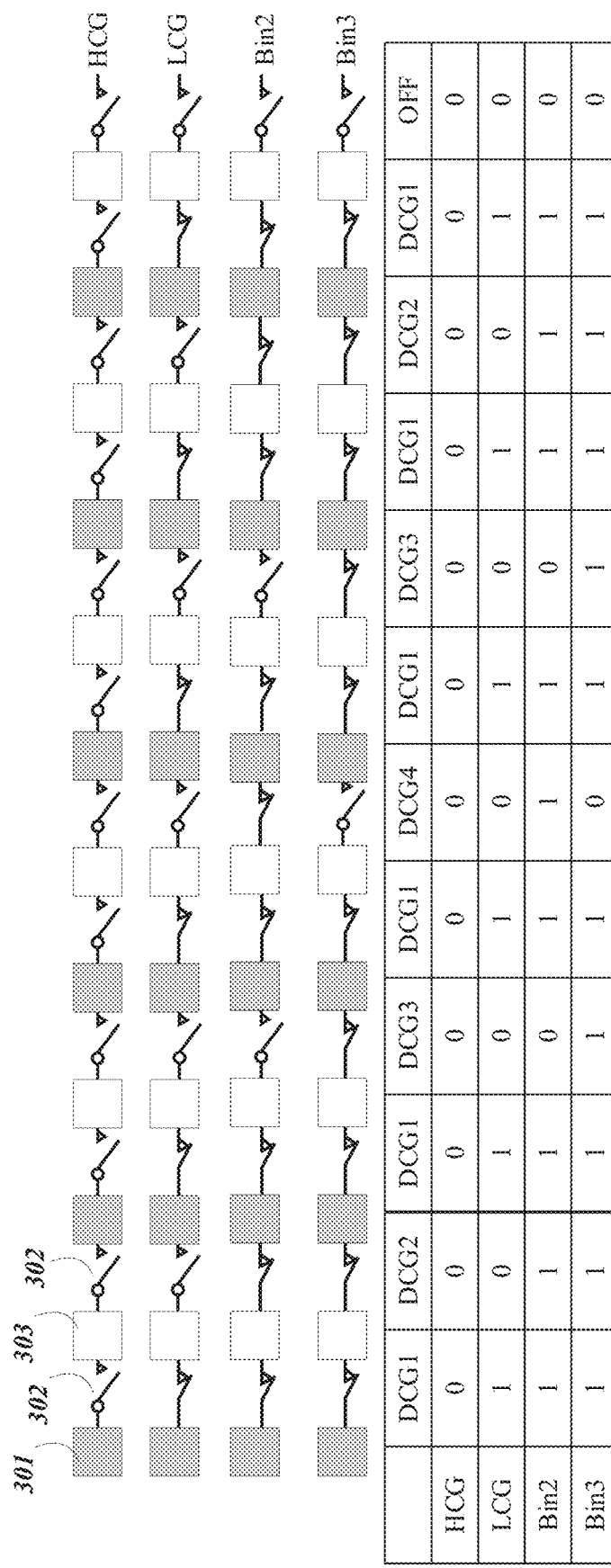
FIG. 3 illustrates example connections of photodiode circuits in accordance with the teachings of the present invention.

FIG. 3 illustrates example connections of photodiode circuits in accordance with the teachings of the present invention. First and second photodiode circuits 301 and 303 may be connected by binning switches 302, both from first photodiode circuit 301 to second photodiode circuit 303 and from second photodiode circuit 303 to first photodiode circuit 301. The first and second photodiode circuits 301 and 303 may represent the sets of transfer transistors 120-123 and the respective connected photodiodes 110-113 in a first or second row of the image sensor circuit 220. For example, the first photodiode circuit 301 may be a set of first transfer transistors 120, and the second photodiode circuit 303 may be a set of third transfer transistors 122. Alternatively, the first photodiode circuit 301 may be a set of second transfer transistors 121, and the second photodiode circuit 303 may be a set of fourth transfer transistors 123. The binning switches 302 may be binning circuits, each including a pair of reset transistors 131 and 132 and binning transistors 133 and 134.

FIG. 3 illustrates a pattern of how to connect the binning control lines 153 using the binning switches 302 which is partially illustrated in FIG. 1A (FIG. 1A shows the first eight binning circuits in the twelve binning circuit pattern described below). The pattern repeats after every 12 photodiode circuits 301, 303. Every other binning switch 302 starting at the first binning switch 302 may be connected to a first binning control line BCL1. A second and tenth binning switch 302 may be connected to a second binning control line BCL2. A fourth and eighth binning switch 302 may be connected to a third binning control line BCL3. A sixth binning switch 302 may be connected to a fourth binning control line BCL4. The twelfth binning switch 302 may be always off during output readout and may not be connected to one of the binning control lines 153. The twelfth binning switch 302 may be omitted (may correspond to a gap in the connection between two photodiode circuits and not a binning circuit). Alternatively, the twelfth binning switch 302 may be connected to a reset line such that it is only used to reset the voltage at the gate of the amplifying transistors 141 and 142. The pattern of connections may repeat for any number of photodiode circuits.

FIG. 3 demonstrates an on voltage being transmitted through one of the binning control lines 153 by showing a closed binning switch 302 in the graphic representation of the binning or a number "1" in the table. Likewise, an off voltage is demonstrated with an open binning switch 302 in the graphic representation of the binning or a number "0" in the table. The table includes indications of which binning control line each binning switch 302 is connected to in this example embodiment. Other configurations of the binning switches 302 are also possible.

The binning switches may be controlled in four different modes of floating diffusion binning: A high conventional gain (HCG) mode, a low conventional gain (LCG) mode, a bin2 mode, and a bin3 mode. In each of these modes the row select signal, transfer control signal, binning control signal, and reset control signal may be sent at a different rate with respect to how frequently these signals will take effect in controlling the image sensor circuit. The rate at which the input signals change depends on the mode and the source follower binning at the bitlines. For example, the input controller 210 may change the row select signal at a first rate when the binning control signal is a first signal for the HCG mode, a second rate when the binning control signal is a second signal for the LCG mode, a third rate when the binning control signal is a third signal for the Bin2 mode, and a fourth rate when the binning control signal is a fourth signal for the Bin3 mode.

In the HCG mode, all of the binning control lines 153 receive an off voltage and the photodiode circuits 301, 303 are not binned through the binning switches 302. The HCG mode provides the highest resolution to the output processing circuit 230 and is the slowest. As described above, the HCG mode may be paired with selection of photodiode outputs via the transfer control signal to provide an even more detailed image or video. This mode may be used for still photography where a large amount of information is collected and there isn't much movement in the image which might be blurred because of the time needed to take the detailed image.

In the LCG mode, the first binning control line (BCL) BCL1 receives an on voltage while the other binning control lines 153 receive off voltages. Thus, the LCG mode groups the photodiode circuits 301, 303 into groups of two photodiode circuits 301, 303. As described above, because the group of two photodiode circuits 301, 303 will include two photodiode circuits 301, 303 of different colors, only one of the photodiode circuits will receive a transfer control signal to output binned photodiode charges. The other photodiode circuits 301, 303 will provide capacitance for the collection of the photodiode charges.

In the Bin2 mode, the first, second, and fourth binning control lines 153 BCL1, BCL2, BCL4 receive an on voltage and the third binning control line BCL3 received an off voltage. Thus, the Bin2 mode groups the photodiode circuits 301, 303 into groups of four photodiode circuits 301, 303. As described above, because the group of four photodiode circuits 301, 303 will include photodiode circuits 301, 303 of different colors (two photodiode circuits 301, 303 of each color), only one color of the photodiode circuits will receive a transfer control signal to output binned photodiode charges. The other photodiode circuits 301, 303 will provide capacitance for the collection of the of the photodiode output charges. The Bin2 mode is faster than the HCG or LCG modes, especially if paired with source follower binning at the bitline such as in a 2×2 binning scheme. Accordingly, the Bin2 mode may be used for a higher frame rate video with lower image quality.

In the Bin3 mode, the first, second and third binning control lines 153 BCL1, BCL2, BCL3 receive an on voltage and the fourth binning control line BCL4 received an off voltage. Thus, the Bin3 mode groups the photodiode circuits 301, 303 into groups of six photodiode circuits 301, 303. As described above, because the group of six photodiode circuits 301, 303 will include photodiode circuits 301, 303 of two different colors (three photodiode circuits 301, 303 of each color), only one color of the photodiode circuits will receive a transfer control signal to output binned photodiode charges. The other photodiode circuits 301, 303 will provide capacitance for the collection of the of the photodiode output charges. The Bin3 mode is faster than the HCG, LCG, or Bin2 modes, especially if paired with source follower binning, done at the bitline level, such as in a 3×3 binning scheme. Accordingly, the Bin3 mode may be used for a fast video mode with higher frame rates but lower image quality. Bin3 mode may also be useful for low light photography.

In the above described modes, the binning circuits including binning transistors 133 and 134 may be coupled to electrically connect sets of transfer transistors 120-123 into groups of sets of transfer transistors 120-123; the groups including any of one, two, four, or six sets of transfer transistors 120-123.

As can be appreciated by the above description of the circuitry and operating modes for the controlling the circuitry, the disclosure provides for an image sensor circuit 220 with a high degree of versatility and with a low amount of space needed for control lines for transmission of control signals for the circuitry.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A photodiode array circuit comprising:
a plurality of photodiode circuits arranged in a grid, wherein each of the photodiode circuits is coupled to receive one of a plurality of transfer control signals and output an output charge to a sense node of the photodiode circuit in response to the transfer control signal, wherein each of the plurality of photodiode circuits is coupled to receive a different one of the plurality of transfer control signals as a proximate photodiode circuit, proximate in a first direction, wherein a first of the plurality of photodiode circuits and a second of the plurality of photodiode circuits that is proximate to the first of the plurality of photodiode circuits in a second direction, perpendicular to the first direction, are coupled to receive a first portion of the plurality of transfer control signals, wherein a third of the plurality of photodiode circuits is proximate to the first of the plurality of photodiode circuits in the first direction, wherein the third and a fourth photodiode circuit, proximate to the third photodiode circuit in a direction opposite the second direction, are coupled to receive a second portion of the plurality of transfer control signals;
binning circuitry coupled to selectively electrically connect the sense nodes of the plurality of photodiode circuits into groups of photodiode circuit sense nodes in response to a binning control signal; and
a plurality of output circuits, wherein each of the plurality of output circuits is coupled to one of the groups of photodiode circuit sense nodes, wherein each of the plurality of output circuits are coupled to receive the output charge from the photodiode circuits in the one of the groups of photodiode circuit sense nodes and output an output signal to a bitline in response to the output charge and an row select signal.

2. The photodiode array circuit of claim 1, wherein the first portion of the plurality of transfer control signals is transmitted on at least one first transfer line and the second portion of the plurality of transfer control signals is transmitted on at least one second transfer line, wherein the first of the plurality of photodiode circuits is electrically connected to the at least one first transfer line and the third of the plurality of photodiode circuits is electrically connected to the at least one second transfer line.

3. The photodiode array circuit of claim 1, wherein every other one of the plurality of photodiode circuits in the second direction collects a charge from a first color of photodiode, and every other one of the plurality of photodiode circuits in the first direction collects a charge from a second color of photodiode.

4. The photodiode array circuit of claim 1, wherein each of the plurality of photodiode circuits includes four photodiodes.

5. The photodiode array circuit of claim 1, wherein a different portion of the row select signal is transmitted on each of a plurality of select lines.

6. The photodiode array circuit of claim 1, wherein a different portion of the binning control signal is transmitted on each of four binning control lines.

7. The photodiode array circuit of claim 6, wherein the number of photodiode circuit sense nodes included in the group of photodiode circuit sense nodes is any of one, two, four, or six photodiode circuits in response to the binning control signal, wherein the binning circuitry includes a plurality of binning connecting circuits, wherein each of the plurality of binning connecting circuits connects two of the plurality of photodiode circuits that are proximate to each other in the first direction, wherein each of the binning connecting circuits is coupled to only one of the four binning control lines.

8. A photodiode array circuit comprising:
a plurality of photodiode circuits, each of the plurality of photodiode circuits coupled to selectively collect output charges from a plurality of photodiodes to a sense node in the photodiode circuit in response to a transfer control signal;
binning circuitry coupled to electrically connect the plurality of photodiode circuit sense nodes into groups of photodiode circuit sense nodes in response to a binning control signal;
a plurality of output circuits each coupled to two of the plurality of photodiode circuits and two bitlines, wherein the plurality of output circuits are coupled to receive the output charges from the two of the plurality of photodiode circuits, wherein the plurality of output circuits are coupled to output an output signal to one of the two bitlines in response to an row select signal, the output charges, and the groups of photodiode circuit sense nodes; and a control circuit coupled to provide the transfer control signal, the row select signal and the binning control signal.

9. The photodiode array circuit of claim 8, wherein the plurality of photodiode circuits are arranged in a grid, wherein the two of the plurality of photodiode circuits coupled to each of the plurality of output circuits are proximate to each other in a first direction, and wherein the binning circuitry electrically connects the photodiode circuits sense nodes into groups in a second direction perpendicular to the first direction.

10. The photodiode array circuit of claim 9, wherein a first of the plurality of photodiode circuits is coupled to a same one of the plurality of output circuits as a second of the plurality of photodiode circuits that is proximate to the first of the plurality of photodiode circuits in the first direction, and wherein a third of the plurality of photodiode circuits that is proximate to the first of the plurality of photodiode circuits in the second direction is coupled to a same one of the plurality of output circuits as a fourth of the plurality of photodiode circuits that is proximate to the third of the plurality of photodiode circuits in a direction opposite the first direction.

11. The photodiode array circuit of claim 8, wherein the binning circuitry includes a reset switch coupled to reset the output charges at the sense node in response to a reset signal.

12. The photodiode array circuit of claim 8, wherein the control circuit is configured to change the row select signal at each of a first rate when the row select signal is a first signal, a second rate when the row select signal is a second signal, a third rate when the row select signal is a third signal and a fourth rate when the row select signal is a fourth signal.

13. The photodiode array circuit of claim 8, wherein the plurality of output circuits are organized into columns, wherein each column of output circuits is coupled to output the output signals of the column of output circuits to the pair of bitlines, wherein the control circuit is coupled to provide the row select signal such that output signals from multiple output circuits in one column of output circuits are summed on one of the bitlines in the pair of bitlines for the one column of output circuits.

14. A photodiode array circuit comprising:

a plurality of photodiode circuits, each of the plurality of photodiode circuits coupled to selectively collect output charges from at least one photodiode at a sense node of the photodiode circuit;

a plurality of output circuits each coupled to two of the plurality of photodiode circuits, wherein the plurality of output circuits are coupled to receive the output charges from the two of the plurality of photodiode circuits, wherein the plurality of output circuits are coupled to output an output signal; and binning circuitry coupled to electrically connect the sense nodes of the plurality of photodiode circuits into groups of photodiode circuit sense nodes in response to a binning control signal, wherein the number of photodiode circuit sense nodes included in the group of photodiode circuit sense nodes is any of one, two, four, or six photodiode circuits in response to the binning control signal, wherein a different portion of the binning control signal is transmitted on each of four binning control lines, wherein the binning circuitry includes a plurality of binning connecting circuits, wherein each of the plurality of binning connecting circuits connects two of the plurality of photodiode circuits that are proximate to each other in a first direction, wherein each of the binning connecting circuits is coupled to only one of the four binning control lines.

15. The photodiode array circuit of claim 14, wherein the plurality of photodiode circuits are arranged in a grid, wherein the two of the plurality of photodiode circuits coupled to each of the plurality of output circuits are proximate to each other in a second direction, and wherein the binning circuitry electrically connects the plurality of photodiode circuit sense nodes into groups in the first direction perpendicular to the second direction.

16. The photodiode array circuit of claim 15, wherein a first of the plurality of photodiode circuits is coupled to a same one of the plurality of output circuits as a second of the plurality of photodiode circuits that is proximate to the first of the plurality of photodiode circuits in the second direction, and wherein a third of the plurality of photodiode circuits, that is proximate to the first of the plurality of photodiode circuits in the first direction, is coupled to a same one of the plurality of output circuits as a fourth of the plurality of photodiode circuits that is proximate to the third of the plurality of photodiode circuits in a direction opposite the second direction.

17. The photodiode array circuit of claim 16, wherein every other one of the plurality of photodiode circuits in the first direction collects a charge from a first color of photodiode and every other one of the plurality of photodiode circuits in the second direction collects the charge from the first color of photodiode.

18. The photodiode array circuit of claim 17, wherein a first portion of the transfer control signal is transmitted on at least one first transfer line and a second portion of the transfer control signal is transmitted on at least one second transfer line, wherein the first of the plurality of photodiode circuits is electrically connected to the at least one first transfer line and the third of the plurality of photodiode circuits is electrically connected to the at least one second transfer line.

19. The photodiode array circuit of claim 14, wherein the each of the plurality of photodiode circuits is coupled to selectively sum output charges from four photodiodes.

20. The photodiode array circuit of claim 14, wherein the plurality of output circuits are each coupled to two bitlines, wherein the plurality of output circuits are coupled to output an output signal to one of the two bitlines in response to an row select signal, and wherein a different portion of the row select signal is transmitted on each of four select lines.

21. The photodiode array circuit of claim 14, wherein the binning circuitry includes a reset switch coupled to reset the output charges at the sense node in response to a reset signal.

22. The photodiode array circuit of claim 14, wherein the plurality of output circuits are organized into columns, wherein each column of output circuits is coupled to output the output signals of the column of output circuits to the pair of bitlines.

* * * * *